US009136672B2

(12) United States Patent
Luo et al.

(10) Patent No.: US 9,136,672 B2
(45) Date of Patent: Sep. 15, 2015

(54) OPTICAL LIGHT SOURCE

(71) Applicant: Agency for Science, Technology and Research, Singapore (SG)

(72) Inventors: Xianshu Luo, Singapore (SG); Junfeng Song, Singapore (SG); Haifeng Zhou, Singapore (SG); Tsung-Yang Liow, Singapore (SG); Mingbin Yu, Singapore (SG); Patrick Guo-Qiang Lo, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/090,543

(22) Filed: Nov. 26, 2013

(65) Prior Publication Data

US 2014/0153600 A1 Jun. 5, 2014

(30) Foreign Application Priority Data

Nov. 29, 2012 (SG) .................................. 201208824

(51) Int. Cl.
| | |
|---|---|
| *H01S 5/00* | (2006.01) |
| *H01S 5/10* | (2006.01) |
| *H01S 5/02* | (2006.01) |
| *B82Y 20/00* | (2011.01) |
| *H01S 5/343* | (2006.01) |
| *H01S 5/065* | (2006.01) |
| *H01S 5/125* | (2006.01) |

(52) U.S. Cl.
CPC .............. *H01S 5/1032* (2013.01); *B82Y 20/00* (2013.01); *H01S 5/021* (2013.01); *H01S 5/0657* (2013.01); *H01S 5/1014* (2013.01); *H01S 5/125* (2013.01); *H01S 5/343* (2013.01)

(58) Field of Classification Search
CPC ........... H01S 5/026; H01S 5/141; H01S 5/34; H01S 5/021; H01S 5/1032; H01S 5/0064; H01S 5/1096; H01S 5/125; H01S 5/18361
USPC ........... 372/40, 43.01, 44.01, 45.012, 45.013, 372/18
See application file for complete search history.

(56) References Cited

U.S. PATENT DOCUMENTS

| | | | |
|---|---|---|---|
| 6,845,115 B2 * | 1/2005 | Flory et al. ................. | 372/43.01 |
| 8,731,017 B2 * | 5/2014 | Clifton et al. ............ | 372/45.011 |
| 8,767,792 B2 * | 7/2014 | Bowers et al. .................. | 372/75 |
| 2011/0158274 A1 * | 6/2011 | Gapontsev et al. ........ | 372/44.01 |
| 2012/0189025 A1 * | 7/2012 | Zheng et al. ..................... | 372/20 |
| 2012/0300796 A1 * | 11/2012 | Sysak et al. ....................... | 372/6 |
| 2012/0320939 A1 * | 12/2012 | Baets et al. ................ | 372/45.01 |
| 2013/0016744 A1 * | 1/2013 | Li et al. ............................ | 372/20 |
| 2013/0259077 A1 * | 10/2013 | Ben Bakir et al. ......... | 372/44.01 |
| 2014/0269800 A1 * | 9/2014 | Purnawirman et al. ......... | 372/40 |
| 2014/0376857 A1 * | 12/2014 | Chantre et al. .................. | 385/14 |

OTHER PUBLICATIONS

Fang, et al., Electrically Pumped Hybrid AlGaInAs—Silicon Evanescent Laser, 14 Optics Express 9203 (2006).

(Continued)

*Primary Examiner* — Jessica Stultz
*Assistant Examiner* — Delma R Forde
(74) *Attorney, Agent, or Firm* — K. Davda Crockett, Esq.; Niky Economy Syrengelas, Esq.; Crockett & Crockett, PC

(57) ABSTRACT

An optical light source is provided. The optical light source includes a waveguide including two reflectors arranged spaced apart from each other to define an optical cavity therebetween, an optical gain medium, and a coupling structure arranged to couple light between the optical cavity and the optical gain medium.

18 Claims, 5 Drawing Sheets

(56) References Cited

OTHER PUBLICATIONS

Chang, et al., 1310nm Silicon Evanescent Laser, 15 Optics Express 11466 (2007).

Fang, et al., A Racetrack Mode-Locked Silicon Evanescent Laser, 16 Optics Express 1393 (2008).

Koch, et al., Mode-Locked Silicon Evanescent Lasers, 15 Optics Express 11225 (2007).

Tu, et al., Thermal Independent Silicon-Nitride Slot Waveguide Biosensor with High Sensitivity, 20 Optics Express 2640 (2012).

* cited by examiner

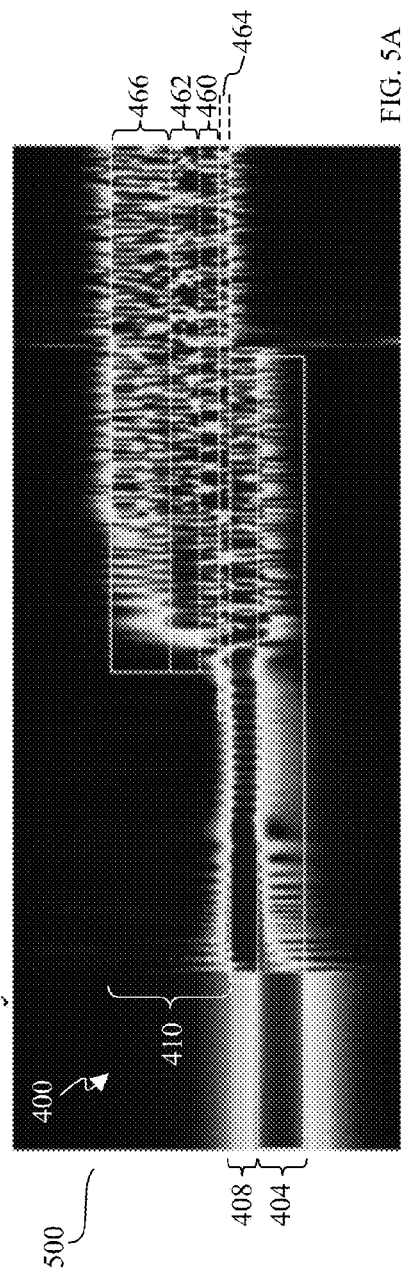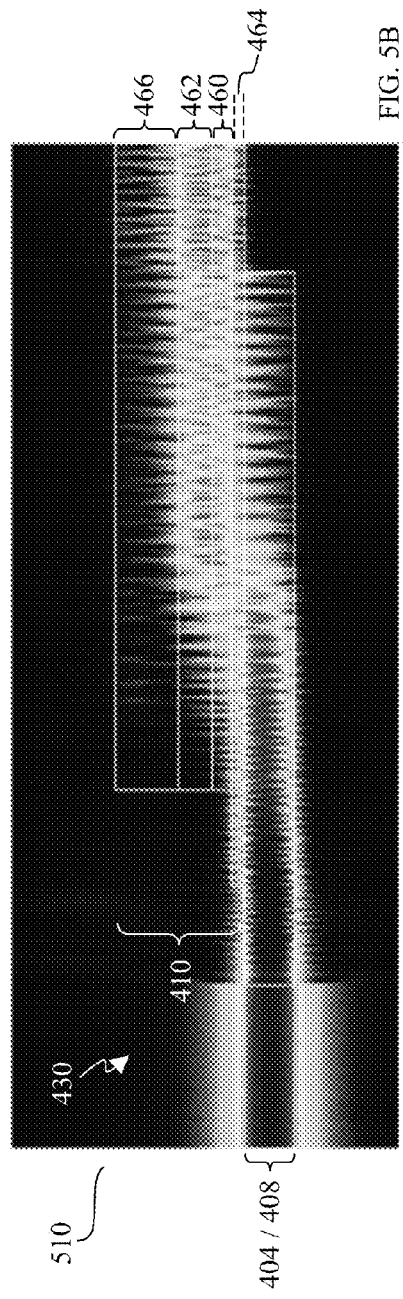

OPTICAL LIGHT SOURCE

CROSS-REFERENCE TO RELATED APPLICATION

This application claims the benefit of priority of Singapore patent application No. 201208824-1, filed Nov. 29, 2012, the contents of which are incorporated herein by reference for all purposes.

TECHNICAL FIELD

Various embodiments relate to an optical light source.

BACKGROUND

In next-generation high-bandwidth low-power computing, the conventional on-chip copper interconnects, which route the electronic signals, will become bandwidth-limiting and also cause excessive electrical power consumption. Silicon photonics based optical interconnects are considered as one potential solution, where high bandwidth optical signals are routed through integrated low-loss optical waveguides. In contrast to the electrical interconnects (the copper wires), optical interconnects have many advantages, such as low crosstalk, immunity to electromagnetic interference, and low power consumption. Most importantly, optical interconnects are expected to provide a much larger bandwidth than the electrical interconnects. Wavelength-division multiplexing (WDM) technology provides a way to further increase the data capacity.

An optical light source is a key component for applications such as long-haul and data-center optical communication and on-chip optical interconnection. In the past ten years, silicon photonics has experienced unprecedented growth in research and development activities, as a possible technology towards next-generation multi-channel optical communications and optical interconnects for computer communication (compcom). However, silicon, as an indirect bandgap material, cannot emit light efficiently. While SOI (silicon-in-insulator) is a promising material platform for low-cost low-power-consumption devices for on-chip interconnection and optical communications, yet it lacks an efficient light source. This means that it is required to adopt an off-chip optical light source for signal transmission.

Although silicon is an indirect bandgap material which is not considered as an efficient light source, various solutions including erbium (Er)-doped silicon laser, hybrid-integrated evanescent lasers, and Ge-on-Si laser have been proposed, among which the hybrid-integrated evanescent lasers, such as a hybrid optical light source using III-V bonding to silicon wafer, are considered as the most promising way for on-chip light sources. Thanks to the enabling complementary Complementary Metal-Oxide-Semiconductor (CMOS) fabrication technologies, a myriad of essential silicon photonic passive and active components have been fabricated, including micrometer-scale optical filters, 10-40 Gbit/s-speed low-power-consumption modulators, and GHz-bandwidth germanium (Ge)-on-silicon (Si) and hybrid III-V-on-Si photodetectors.

Almost all of today's hybrid silicon (Si) lasers use a dual-material system, which means direct bonding of III-V onto a Si waveguide. The laser cavity is defined by the Si waveguide and the cleaved/polished interfaces, which means a relatively high cavity loss. The optical light is mostly confined in the Si waveguide, which means low amplification efficiency. The issues for such a dual-waveguide system for a laser cavity include: 1) The Si waveguide usually has ~2 dB/cm propagation loss, which is relatively high, especially for some advanced light sources, such as mode-locked lasers where optical loss is critical; 2) The light is mostly confined inside the Si waveguide with only ~4.3% light confined in the III-V gain medium, thus the amplification efficiency is low; 3) Cleaved/polished interface(s) for the formation of a laser cavity provides less optical control and low productivity.

Therefore, the problem for conventional hybrid Si lasers is the relatively high Si waveguide loss for the laser cavity, leading to a high threshold and high power consumption. Such high loss could be a major issue for advanced hybrid lasers, such as the mode-locked lasers.

SUMMARY

According to an embodiment, an optical light source is provided. The optical light source may include a waveguide including two reflectors arranged spaced apart from each other to define an optical cavity therebetween, an optical gain medium, and a coupling structure arranged to couple light between the optical cavity and the optical gain medium.

According to an embodiment, an optical light source is provided. The optical light source may include a waveguide including two Bragg reflectors arranged spaced apart from each other to define an optical cavity therebetween, wherein the waveguide includes at least one of a silicon nitride-based material or silicon oxynitride-based material, and an optical gain medium optically coupled to the optical cavity.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 5A shows a plot of the calculated intensity transitions between the different waveguide layers of the embodiment of FIG. 4A.

FIG. 5B shows a plot of the calculated intensity transitions between the different waveguide layers of the embodiment of FIG. 4B.

DETAILED DESCRIPTION

Figure 1A:
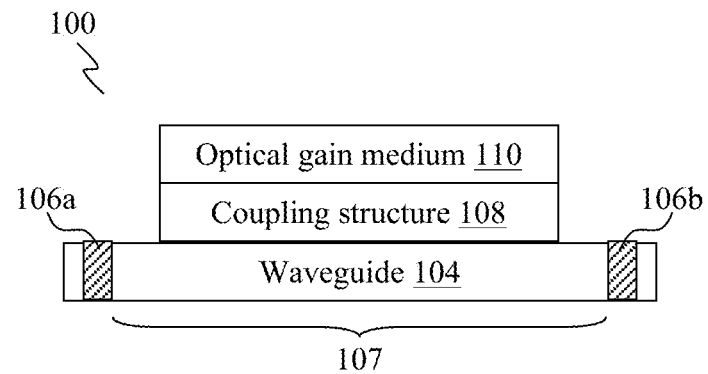
FIG. 1A shows a schematic cross-sectional view of an optical light source, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the devices are analogously valid for the other device.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to fields including silicon (Si) photonics (e.g. Si nano/micro-photonics), optical communication system, and data center/on-chip optical interconnect.

Various embodiments may provide an optical light source (e.g. a hybrid Si laser) using a multi-layered waveguide structure. Various embodiments may provide a triple-layered waveguide structure for the optical light source, having an arrangement of a waveguide configured as an optical or laser cavity, an optical gain medium, and a coupling structure or intermediate layer therebetween for coupling light between the waveguide and the optical gain medium. As non-limiting examples, the optical light source may employ silicon nitride (SiN) or silicon oxynitride (SiON) for the long laser cavity, a bonded III-V layer or structure as the gain medium, and amorphous silicon (a-Si) for enhancing the light coupling between the SiN or SiON waveguide and the III-V layer. Various embodiments may employ chirped distributed Bragg reflectors (DBRs) as the mirror reflectors to define the optical cavity. The mirror reflectors may be formed as part of the SiN or SiON waveguide. Various embodiments may adopt inverse tapers for the coupling between the SiN or SiON waveguide and the a-Si coupling structure, and/or between the a-Si coupling structure and the III-V layer.

Various embodiments may provide an optical light source (e.g. a hybrid Si laser) using a low-loss waveguide, such as silicon nitride (SiN) or silicon oxynitride (SiON) as the laser cavity waveguide, and/or using distributed Bragg mirrors (DBRs) for the laser cavity mirrors.

A SiN or SiON waveguide may provide a low-loss waveguide for the laser cavity. A SiN waveguide may have a propagation loss of about 0.6 dB/cm, while a SiON waveguide may have a propagation loss of about 0.1 dB/cm, as compared to a silicon waveguide having a propagation loss of about 2 dB/cm. Therefore, using SiN and SiON waveguides may significantly reduce the cavity loss. A reduced cavity loss may enable a lower threshold voltage and a lower power consumption.

In various embodiments, employing SiN or SiON DBRs to form the optical laser cavity may allow a controllable fabrication process that may enable potential mass production, and may avoid the low yield end-face polishing and antireflection coating for forming reflecting mirrors.

Various embodiments may provide a high-performance hybrid laser with a low threshold and a low power consumption. Various embodiments may provide a cost effective hybrid laser for silicon integrated circuits.

FIG. 1A shows a schematic cross-sectional view of an optical light source 100, according to various embodiments. The optical light source 100 includes a waveguide 104 including two reflectors 106a, 106b arranged spaced apart from each other to define an optical cavity 107 therebetween, an optical gain medium 110, and a coupling structure 108 arranged to couple light between the optical cavity 107 and the optical gain medium 110.

In other words, the optical light source 100 may include a waveguide 104, and a first reflector 106a and a second reflector 106b formed or defined in the waveguide 104. The first reflector 106a and the second reflector 106b may define an optical cavity 107 in the spacing between them in the waveguide 104 and serve to reflect light propagating in the optical cavity 107. The optical light source 100 may further include an optical gain medium 110 which may provide optical gain for light propagating in the optical light source 100 and which interacts with the optical gain medium 110. The optical light source 100 may further include a coupling structure 108 optically coupled to the optical cavity 107 and the optical gain medium 110.

In various embodiments, light may be coupled between the waveguide 104 and the optical gain medium 110. For example, light may be coupled in a direction from the waveguide 104 to the coupling structure 108 and then to the optical gain medium 110. Light may also be coupled in the reverse direction.

In various embodiments, light propagating in the optical cavity 107 may be reflected by the two reflectors 106a, 106b and coupled to the optical gain medium 110. Light may be coupled to the optical gain medium 110 one or more times, where the light may be amplified. Therefore, the two reflectors 106a, 106b and the optical gain medium 110 may cooperate to cause lasing within the optical cavity 107. In this way, the optical cavity 107 may act as a laser cavity or lasing cavity that may enable amplification of light within the optical light source 100, where the amplified light may be emitted from the optical light source 100 as an optical signal.

In various embodiments, the coupling structure 108 may be arranged in between the waveguide 104 and the optical gain medium 110. The coupling structure 108 may be arranged in between the optical cavity 107 and the optical gain medium 110. This may mean that the optical gain medium 110 may be spaced apart from the waveguide 104 and the optical cavity 107. Further, this may mean that the waveguide 104 having the optical cavity 107, the coupling structure 108 and the optical gain medium 110 may be arranged in a stack structure, where the coupling structure 108 may be arranged over the optical cavity 107 and the optical gain medium 110 may be arranged over the coupling structure 108. Therefore, the optical light source 100 may include a triple-layered structure including the waveguide 104, the coupling structure 108 and the optical gain medium 110.

In various embodiments, the waveguide 104, the coupling structure 108 and the optical gain medium 110 may be formed as respective or individual layers.

In various embodiments, the waveguide 104, the coupling structure 108 and the optical gain medium 110 may be formed at different planes.

In various embodiments, the coupling structure 108 may be arranged in contact with the optical cavity 107 (and therefore also the waveguide 104) and/or the optical gain medium 110.

In various embodiments, the coupling structure 108 may be arranged overlapping with at least one of the optical cavity 107 or the optical gain medium 110. The entire coupling structure 108 may overlap with the optical cavity 107. The entire optical gain medium 110 may overlap with the coupling structure 108.

In various embodiments, the coupling structure 108 may be another waveguide.

In various embodiments, the optical gain medium 110 may be arranged over the waveguide 104, for example over the optical cavity 107 defined in the waveguide 104. The optical gain medium 110 may be arranged overlapping with the optical cavity 107. The entire optical gain medium 110 may overlap with the optical cavity 107. The optical gain medium 110 may be optically coupled to the optical cavity 107.

In various embodiments, at least one reflector of the two reflectors 106a, 106b may allow light to exit from the optical light source 100. For example, the second reflector 106b may be a partial reflector to allow some light to be reflected and some light to be transmitted through the second reflector 106b to be emitted from the optical light source 100. In various embodiments, the first reflector 106a may be a full reflector or a partial reflector.

In various embodiments, the coupling structure 108 may be arranged spaced apart from at least one of the optical cavity 107 or the optical gain medium 110. This may mean that the coupling structure 108 may not be in contact with the optical cavity 107 and/or the optical gain medium 110. Further, this may mean that the coupling structure 108 may be spaced apart from the waveguide 104.

In the context of various embodiments, the waveguide 104 may include a material capable of inducing a propagation loss of less than 2 dB/cm. Therefore, the material of the waveguide 104 may be capable of inducing a propagation loss that is less than that for silicon, which has a propagation loss of 2 dB/cm or more. As non-limiting examples, the material of the waveguide 104 may be capable of inducing a propagation loss of less than about 1.5 dB/cm, less than about 1.0 dB/cm, or less than about 0.5 dB/cm, for example a propagation loss of about 1 dB/cm, about 0.6 dB/cm or about 0.1 dB/cm. With a propagation loss of less than 2 dB/cm, the waveguide 104 may be referred to as a low-loss waveguide.

In the context of various embodiments, the waveguide 104 may include at least one of a silicon nitride-based material (e.g. SiN) or silicon oxynitride-based material (e.g. SiON). A silicon nitride-based waveguide 104 may induce a propagation loss of approximately 0.6 dB/cm, while a silicon oxynitride-based waveguide 104 may induce a propagation loss of approximately 0.1 dB/cm. Therefore, a silicon nitride-based waveguide 104 or a silicon oxynitride-based waveguide 104 may be a low-loss waveguide.

In various embodiments, the coupling structure 108 may be embedded in the waveguide 104. For example, the coupling structure 108 may be embedded in the waveguide 104 such that at least one surface of the coupling structure 108 and at least one surface of the waveguide 104 may be at least substantially coplanar.

In the context of various embodiments, the coupling structure 108 may have a refractive index in between respective refractive indices of the waveguide 104 and the optical gain medium 110. In various embodiments, the refractive index of the coupling structure 108 may be biased towards the refractive index of the optical gain medium 110, for example close to the refractive index of the optical gain medium 110, e.g. at least substantially matched to the refractive index of the optical gain medium 110.

In the context of various embodiments, the refractive index of the waveguide 104 may be in a range of between about 1.45 (such as a SiON waveguide) and about 2.0 (such as a SiN waveguide), for example between about 1.45 and about 1.8, between about 1.45 and about 1.6, or between about 1.6 and about 2.0.

In the context of various embodiments, the refractive index of the optical gain medium 110 may be in a range of between about 3.0 and about 3.8, for example between about 3.0 and about 3.5, between about 3.0 and about 3.2, between about 3.2 and about 3.8 or between about 3.2 and about 3.5.

In the context of various embodiments, the refractive index of the coupling structure 108 may be in a range of between about 3.5 (e.g. a poly-crystalline Si coupling structure) and about 4.0 (e.g. an amorphous Si coupling structure), for example between about 3.5 and about 3.8, between about 3.5 and about 3.6, or between about 3.8 and about 4.0.

In the context of various embodiments, the coupling structure 108 may have a thickness between about 50 nm and about 500 nm, for example between about 50 nm and about 300 nm, between about 50 nm and about 100 nm, between about 100 nm and about 500 nm, between about 100 nm and about 200 nm, or between about 200 nm and about 400 nm.

In the context of various embodiments, the coupling structure 108 may include amorphous silicon (a-Si) or poly-crystalline Si (poly-Si).

In the context of various embodiments, the optical gain medium 110 may include a multiple quantum well (MQW) region, with an arrangement including but not limited to 8×$In_{0.653}Al_{0.055}Ga_{0.292}As$ well/9×$In_{0.45}Al_{0.089}Ga_{0.461}As$ barriers.

In various embodiments, the optical gain medium 110 may further include at least one separate confinement heterostructure (SCH) layer arranged over the MQW region. At least one lower separate confinement heterostructure layer may additionally or alternatively be arranged below the multiple quantum well region. In various embodiments, a separate confinement heterostructure (SCH) layer may have a refractive index that may be lower than that of the MQW region, for effectively confining light in the MQW region.

In various embodiments, the optical gain medium 110 may further include a cladding layer. The cladding layer may be arranged over the MQW region. The cladding layer may also be arranged over the SCH layer. In the context of various embodiments, the cladding layer may have a thickness between about 0.1 micron (μm) and about 1.5 micron (μm), for example between about 0.1 μm and about 1.0 μm, between about 0.1 μm and about 0.5 μm, between about 0.5 μm and about 1.5 μm, between about 1.0 μm and about 1.5 μm, or between about 0.3 μm and about 0.8 μm.

In various embodiments, the optical gain medium 110 may further include an underlayer or slab below the MQW region. The underlayer or slab may be in the form of a waveguide.

In the context of various embodiments, a section of the optical gain medium 110 may be configured as a saturable absorber section. The remaining section of the optical gain medium 110 may be configured as a gain region or section (e.g. a saturable gain section). In various embodiments, the saturable absorber section may be electrically isolated from the gain section of the optical gain medium 110. The term "saturable absorber section" may mean a section where the absorption of light may decrease with increasing light intensity. By having a saturable absorber section, the optical light source 100 may be configured as a mode-locked laser.

In the context of various embodiments, the optical gain medium 110 may include a III-V material, for example in the form of a III-V bonding layer. Therefore, the optical light source 100 may be a hybrid optical light source (e.g. a hybrid laser) integrating a III-V optical gain medium 110 with the waveguide 104, for example a silicon nitride-based or silicon oxynitride-based waveguide 104.

In the context of various embodiments, the III-V material may be selected from the group consisting of aluminium gallium arsenide (AlGaAs), aluminium gallium indium phosphide (AlGaInP), aluminium gallium nitride (AlGaN), aluminium gallium phosphide (AlGaP), aluminium nitride (AlN), aluminium phosphide (AlP), boron nitride (BN), boron phosphide (BP), gallium arsenide (GaAs), gallium arsenide phosphide (GaAsP), gallium nitride (GaN), gallium phosphide (GaP), indium gallium arsenide (InGaAs), indium gallium nitride (InGaN), indium gallium phosphide (InGaP), indium nitride (InN), and indium phosphide (InP).

In the context of various embodiments, at least one of the two reflectors 106a, 106b may be or may include a Bragg reflector, e.g. a Bragg reflection grating or a distributed Bragg reflector (DBR). The Bragg reflector may have a structure with a varying (periodic or non-periodic) refractive index, for example alternating refractive indices, which may generate a wavelength specific reflector that may reflect one or more wavelengths of light. In various embodiments, the Bragg reflector may be a chirped Bragg reflector, e.g. a chirped distributed Bragg reflector, where variation in the refractive index of the chirped Bragg reflector may be non-periodic (or non-uniform).

In the context of various embodiments, the optical light source 100 may further include a substrate, where the waveguide 104 may be arranged over or on the substrate. The substrate may be a semiconductor substrate, e.g. a silicon (Si) substrate or a silicon-on-insulator (SOI) substrate.

In various embodiments, at least one of the coupling structure 108 or the optical gain medium 110 may include a tapering region, for example having an inverse taper configuration. Respective tapering regions of the coupling structure 108 and the optical gain medium 110 may at least substantially overlap with each other.

In the context of various embodiments, the waveguide 104 may include a first waveguide section and a second waveguide section spaced apart from the first waveguide section, and the coupling structure 108 may include a first coupling section arranged to couple light between the first waveguide section and the optical gain medium 110, and a second coupling section arranged to couple light between the second waveguide section and the optical gain medium 110. In various embodiments, the second coupling section may be spaced apart from the first coupling section.

In various embodiments, at least a portion of the first waveguide section may be arranged at least substantially overlapping with a portion of the first coupling section, and at least a portion of the second waveguide section may be arranged at least substantially overlapping with a portion of the second coupling section.

In various embodiments, the first waveguide section and the first coupling section may be arranged offset (e.g. horizontally offset) relative to each other and the second waveguide section and the second coupling section may be arranged offset (e.g. horizontally offset) relative to each other.

In various embodiments, a first portion of the optical gain medium 110 may be arranged at least substantially overlapping with a portion of the first coupling section, and a second portion of the optical gain medium 110 may be arranged at least substantially overlapping with a portion of the second coupling section. The optical gain medium 110 may be arranged offset (e.g. horizontally offset) relative to each of the first coupling section and the second coupling section of the coupling structure 108. In various embodiments, the optical gain medium 110 may not overlap with the first waveguide section and the second waveguide section.

In various embodiments, the first coupling section, the second coupling section and the optical gain medium 110 may form part of the optical cavity 107.

In various embodiments, light may be coupled, in sequence, in a direction from the first waveguide section to the first coupling section, the optical gain medium 110, the second coupling section and the second waveguide section. Light may also be coupled in the reverse direction. Therefore, a first optical path may be defined between the first waveguide section and the optical gain medium 110, through the first coupling section, while a second optical path may be defined between the second waveguide section and the optical gain medium 110, through the second coupling section. In this way, light may be at least substantially fully coupled to the optical gain medium 110.

In various embodiments, the first waveguide section and the second waveguide section may be arranged at least substantially coplanar with each other, and/or the first coupling section and the second coupling section may be arranged at least substantially coplanar with each other.

In various embodiments, the first waveguide section and the first coupling section may be arranged spaced apart (e.g. vertically separated) from each other, and the second waveguide section and the second coupling section may be arranged spaced apart (e.g. vertically separated) from each other.

In various embodiments, the optical gain medium 110 may be arranged spaced apart (e.g. vertically separated) from the first coupling section and the second coupling section.

Figure 1B:
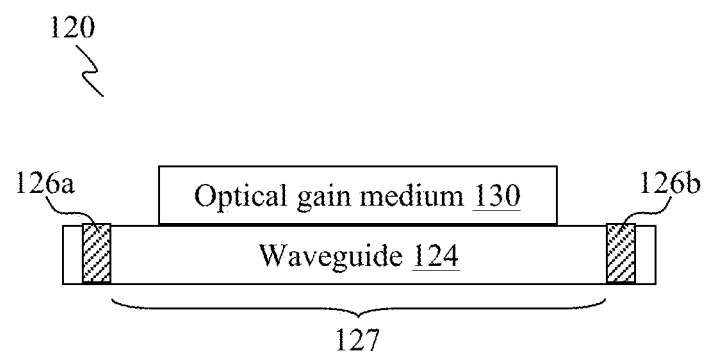
FIG. 1B shows a schematic cross-sectional view of an optical light source, according to various embodiments.

FIG. 1B shows a schematic cross-sectional view of an optical light source 120, according to various embodiments. The optical light source 120 includes a waveguide 124 including two Bragg reflectors 126a, 126b arranged spaced apart from each other to define an optical cavity 127 therebetween, wherein the waveguide 124 includes at least one of a silicon nitride-based material or silicon oxynitride-based material, and an optical gain medium 130 optically coupled to the optical cavity.

In other words, the optical light source 120 may include a silicon nitride-based (e.g. SiN) waveguide 124 or a silicon oxynitride-based (e.g. SiON) waveguide 124. The optical light source 120 may include a first Bragg reflector 126a and a second Bragg reflector 126b formed or defined in the waveguide 124. The first Bragg reflector 126a and the second Bragg reflector 126b may define an optical cavity 127 in the spacing between them in the waveguide 124 and serve to reflect light propagating in the optical cavity 127. The optical cavity 127 may be a lasing cavity or a laser cavity.

In various embodiments, at least one of the two Bragg reflectors 126a, 126b may be or may include a distributed Bragg reflector (DBR) or a Bragg reflection grating.

In various embodiments, the optical gain medium 130 may be arranged over the waveguide 124, for example over the optical cavity 127. The optical gain medium 130 may include a III-V material. Non-limiting examples of the III-V material may be as described above.

In various embodiments, the optical light source 120 may further include a coupling structure arranged to couple light between the optical cavity 127 and the optical gain medium 130. The coupling structure may be another waveguide. The coupling structure may be arranged in between the waveguide 124 and the optical gain medium 130. The coupling structure may include amorphous silicon (a-Si).

It should be appreciated that the optical light source 120 may include one or more features as described in the context of the optical light source 100.

Various embodiments may provide an optical light source having one or more of the following: (1) a low-loss waveguide to form the laser cavity for high-performance optical light emission, (2) enhanced light confinement in a multiple quantum well (MQW) gain region for increased lasing efficiency, or (3) a distributed Bragg reflector (DBR) mirror design with controllable optical properties and mass production potential.

The optical light source of various embodiments may adopt a low-loss SiN or SiON platform for the optical or laser cavity, for example in the form of a waveguide. A III-V gain medium may be fusion bonded onto the passive optical light source device for optical gain. The optical light source may adopt amorphous silicon (a-Si) between the SiN or SiON waveguide and the III-V gain medium for enhanced light coupling.

Figure 2:
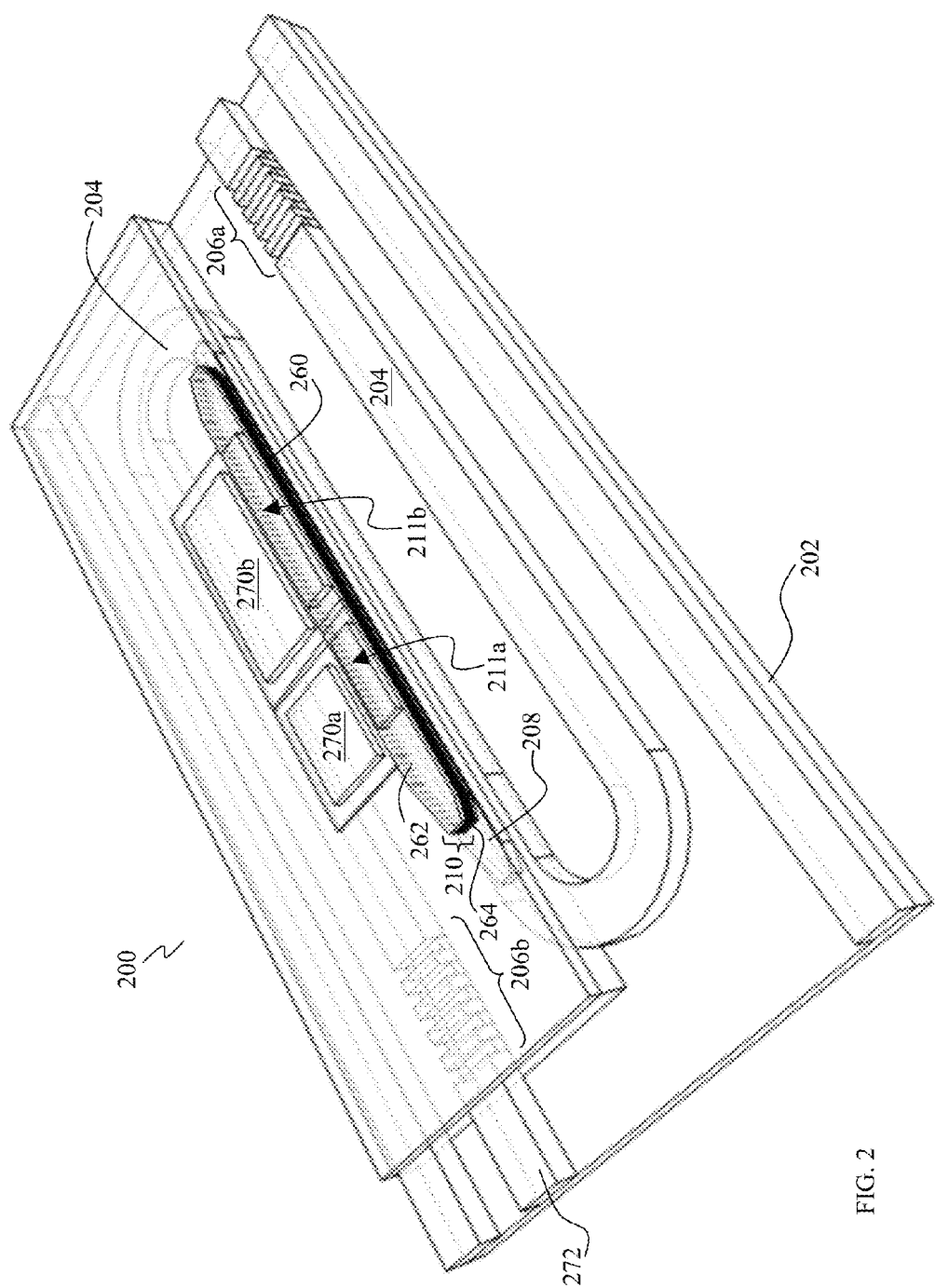
FIG. 2 shows a perspective view of an optical light source, according to various embodiments.

FIG. 2 shows a perspective view of an optical light source 200, according to various embodiments. The optical light source 200 may include a silicon-on-insulator (SOI) substrate having a buried oxide (BOX) layer 202. The optical light source 200 may employ a triple-layered waveguide structure formed on the substrate, for example over the BOX layer 202. The triple-layered waveguide structure may include a waveguide (e.g. a low-loss optical waveguide) 204 with a first reflector (e.g. a distributed Bragg reflector (DBR) or a Bragg reflection grating) 206a and a second reflector (e.g. a distributed Bragg reflector (DBR) or a Bragg reflection grating) 206b to define an optical or laser cavity, an optical gain medium 210, which may be in the form of a III-V bonded layer, and a sandwiched waveguide 208, as a coupling structure, between them for efficient light coupling between the waveguide 204 and the optical gain medium 210. The waveguide 204 may provide a low-loss guide in the cavity.

The optical gain medium 210 may include a stack arrangement including a multiple quantum well (MQW) region 260. The stack arrangement may further include an underlayer 264 below the MQW 260 and a separate confinement heterostructure (SCH) layer 262 over the MQW 260. The optical gain medium 210 may be defined into a saturable absorber section 211a and a saturable gain section 211b. The saturable absorber section 211a and the saturable gain section 211b may be electrically isolated from each other. Each of the saturable absorber section 211a and the saturable gain section 211b may include a cladding layer and a contact layer arranged over the SCH layer 262. The contact layer of the saturable absorber section 211a may be electrically coupled to the reverse-biased electrode 270a for application of a reverse bias electrical signal (e.g. a voltage) to the saturable absorber section 211a. The contact layer of the saturable gain section 211b may be electrically coupled to a current injection electrode 270b for application of an electrical signal (e.g. a voltage) to the saturable gain section 211b.

The coupling structure 208 may be formed on top of the waveguide 204, and the optical gain medium 210 may be formed on top of the coupling structure 208. As a non-limiting example, the optical gain medium 210 may be bonded to the coupling structure 208. The waveguide 204 may have a meander or serpentine shape, as shown in FIG. 2, a linear (straight) shape, or any other suitable shape for light propagation and coupling.

In various embodiments, in silicon (Si) platform, the waveguide 204, as a low-loss waveguide, may be a silicon nitride-based waveguide or a silicon oxynitride-based waveguide. As non-limiting examples, the waveguide 204 may be a silicon nitride (SiN) waveguide which may have a propagation loss of about 0.6 dB/cm or a silicon oxynitride (SiON) waveguide which may have a propagation loss of about 0.1 dB/cm, compared to a propagation loss of 2 dB/cm for a silicon (Si) waveguide.

In various embodiments, the optical gain medium 210 may include a III-V bonding material, for example including an indium phosphide (InP) multiple quantum well (MQW) structure 260 which may provide optical gain. Such on-silicon III-V gain material may be achieved via wafer bonding technique, for example fusion bonding.

The sandwiched waveguide structure 208 may be provided for efficiency coupling purposes. In various embodiments, as the refractive index of SiN and SiON is approximately 2 while InP has a refractive index of approximately 4, there may be challenges in efficiently coupling light between the SiN or SiON waveguide 204 and the optical gain medium 210 due to the large index mismatch. Thus, a relatively high index material may be provided in order to match the III-V material refractive index. In various embodiments, amorphous silicon (a-Si) may be employed for the sandwiched waveguide structure 208. This may mean that the waveguide structure 208 may be an amorphous silicon layer. By integrating a III-V optical gain medium and a silicon nitride-based waveguide or a silicon oxynitride-based waveguide, the optical light source 200 may be a hybrid Si optical light source (e.g. a hybrid Si laser).

In operation, light may propagate within the waveguide 204, in the optical cavity defined between the first reflector 206a and the second reflector 206b. Light propagating in the optical cavity may be reflected, at least once, by each of the first reflector 206a and the second reflector 206b. Light may be fully reflected by the first reflector 206a, and partially reflected by the second reflector 206b so that light may exit from the optical cavity via the second reflector 206b and exit the optical light source 200 through an output port 272. Light propagating in the optical cavity may be coupled to the optical gain medium 210 to provide optical gain so as to amplify the light that interacts with the optical gain medium 210. By passing through the optical cavity and the optical gain medium 210 a plurality of times, lasing may occur and the light may be amplified. In this way, the optical light source 200 may act as a laser (e.g. a hybrid Si laser). By having the saturable absorber section 211a, the optical light source 200 may be configured as a mode-locked laser.

Figure 3A:
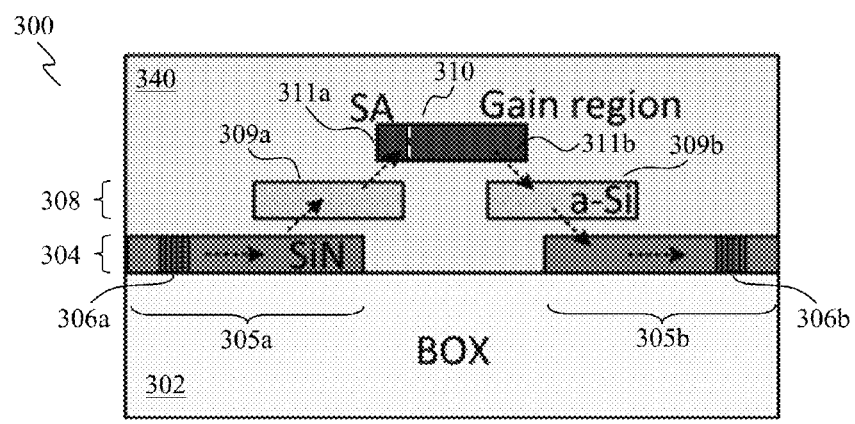
FIG. 3A shows a cross-sectional view of an optical light source, according to various embodiments.

FIG. 3A shows a cross-sectional view of an optical light source 300, according to various embodiments. The optical light source 300 may include a silicon-on-insulator (SOI) substrate having a buried oxide layer (BOX) layer 302. The optical light source 300 includes a silicon nitride-based (e.g. SiN) or a silicon oxynitride-based (e.g. SiON) waveguide 304 arranged over the BOX layer 302, the waveguide 304 having a first waveguide section 305a and a second waveguide section 305b arranged spaced apart from the first waveguide section 305a. Therefore, the waveguide 304 may include individual first waveguide section 305a and second waveguide section 305b separated from each other. The first waveguide section 305a and the second waveguide section 305b may be arranged at least substantially coplanar to each other. A first reflector (e.g. a distributed Bragg reflector (DBR)) 306a may be formed or defined in the first waveguide section 305a, and a second reflector (e.g. a distributed Bragg reflector (DRB)) 306b may be formed or defined in the second waveguide section 305b.

The optical light source 300 may further include an amorphous silicon (a-Si) coupling structure, in the form of an a-Si waveguide 308 arranged over the waveguide 304. The a-Si waveguide 308 may have a first coupling section 309a and a second coupling section 309b arranged spaced apart from the first coupling section 309a. Therefore, the a-Si waveguide 308 may include individual first coupling section 309a and second coupling section 309b separated from each other. The first coupling section 309a and the second coupling section 309b may be arranged at least substantially coplanar to each other.

The optical light source 300 may further include an optical gain medium (e.g. a III-V gain medium) 310, for example in the form of a waveguide. The optical gain medium 310 may be defined into a saturable absorber (SA) section 311a and a gain region or section 311b. The SA section 311a and the gain section 311b may be electrically isolated from each other. The optical gain medium 310 may include a multiple quantum well (MQW) region (not shown).

As shown in FIG. 3A, the waveguide 304, the a-Si waveguide 308 and the optical gain medium 310 may be formed at different planes.

The waveguide 304 including the first waveguide section 305a and the second waveguide section 305b, the a-Si waveguide 308 including the first coupling section 309a and the second coupling section 309b, and the optical gain medium 310 may be embedded in a cladding layer or an insulation layer (e.g. an oxide layer) 340.

As shown in FIG. 3A, the first coupling section 309a may be vertically spaced apart from the first waveguide section 305a. The first coupling section 309a may be horizontally offset relative to the first waveguide section 305a. A coupling region, with a predetermined coupling length (e.g. from a few microns to 100s of microns depending on the designed coupling efficiency, for example between about 1 μm and about 500 μm, e.g. between about 1 μm and about 200 μm), may be defined where a portion of the first coupling section 309a at least substantially overlaps with a portion of the first waveguide section 305a, for coupling of light, as represented by the dashed arrow, between the first coupling section 309a and the first waveguide section 305a.

The second coupling section 309b may be vertically spaced apart from the second waveguide section 305b. The second coupling section 309b may be horizontally offset relative to the second waveguide section 305b. A coupling region, with a predetermined coupling length (e.g. from a few microns to 100s of microns depending on the designed coupling efficiency, for example between about 1 μm and about 500 μm, e.g. between about 1 μm and about 200 μm) may be defined where a portion of the second coupling section 309b at least substantially overlaps with a portion of the second waveguide section 305b, for coupling of light, as represented by the dashed arrow, between the second coupling section 309b and the second waveguide section 305b.

The optical gain medium 310 may be vertically spaced apart from the first coupling section 309a and the second coupling section 309b. The optical gain medium 310 may be horizontally offset relative to the first coupling section 309a and the second coupling section 309b. The optical gain medium 310 may also be vertically spaced apart from the first waveguide section 305a and the second waveguide section 305b. The optical gain medium 310 may also be horizontally offset relative to the first waveguide section 305a and the second waveguide section 305b.

A coupling region, with a predetermined coupling length (e.g. from a few microns to 100s of microns depending on the designed coupling efficiency, for example between about 1 μm and about 500 μm, e.g. between about 1 μm and about 200 μm), may be defined where a portion of the optical gain medium 310 at least substantially overlaps with a portion of the first coupling section 309a. The first coupling section 309a may overlap with the SA section 311a of the optical gain medium 310. Another coupling region, with a predetermined coupling length (e.g. from a few microns to 100s of microns depending on the designed coupling efficiency, for example between about 1 μm and about 500 μm, e.g. between about 1 μm and about 200 μm), may be defined where a portion of the optical gain medium 310 at least substantially overlaps with a portion of the second coupling section 309b. The second coupling section 309b may overlap with the gain region 311b of the optical gain medium 310. In various embodiments, the optical gain medium 310 may not overlap with the first waveguide section 305a and the second waveguide section 305b.

An optical cavity may be defined between the first reflector 306a and the second reflector 306b. The optical cavity may include the first waveguide section 305a, the second waveguide section 305b, the first coupling section 309a, the second coupling section 309b and the optical gain medium 310.

Light may be coupled between the first waveguide section 305a and the second waveguide section 305b. A first optical path may be defined between the first waveguide section 305a and the optical gain medium 310, and a second optical path may be defined between the second waveguide section 305b and the optical gain medium 310. Light may be coupled from the first waveguide section 305a to the second waveguide section 305b, via, in sequence, the first coupling section 309a, the optical gain medium 310 and the second coupling section 309b, and/or vice versa from the second waveguide section 305b to the first waveguide section 305a, via, in sequence, the second coupling section 309b, the optical gain medium 310 and the first coupling section 309a. As a non-limiting example, light propagating in the first waveguide section 305a may be coupled (e.g. at least substantially entirely coupled) to the first coupling section 309a, which in turn may be coupled (e.g. at least substantially entirely coupled) to the SA section 311a of the optical gain medium 310. The light may then propagate through the SA section 311a and the gain region 311b of the optical gain medium 310, coupled (e.g. at least substantially entirely coupled) to the second coupling section 309b, which in turn may be coupled (e.g. at least substantially entirely coupled) to the second waveguide section 305b. As a non-limiting example, light propagating in the optical cavity may be partially reflected by the second reflector 306b and partially transmitted out of the optical light source 300, via the second reflector 306b.

In various embodiments, therefore, the three different waveguides, in terms of the waveguide 304, the a-Si waveguide 308 and the optical gain medium 310, may be separated with only respective overlaps in the respective coupling regions. In this manner, light may propagate back and forth between the first reflector (e.g. a DBR) 306a and the second reflector (e.g. a DBR) 306b in the waveguide 304, and goes through separately the passive waveguide 304 and the optical gain medium (e.g. a III-V gain medium) 310. In the gain medium region 310, the light may be at least substantially fully or completely confined, where the confined light may interact with the gain medium 310 for light amplification. In contrast, in conventional devices, most of the light is confined in the waveguide. In various embodiments, employing a separate waveguide design, e.g. as illustrated in FIG. 3A with the first waveguide section 305a and the second waveguide section 305b, may enable enhanced light confinement in the gain region 310, resulting in enhanced lasing efficiency.

Figure 3B:
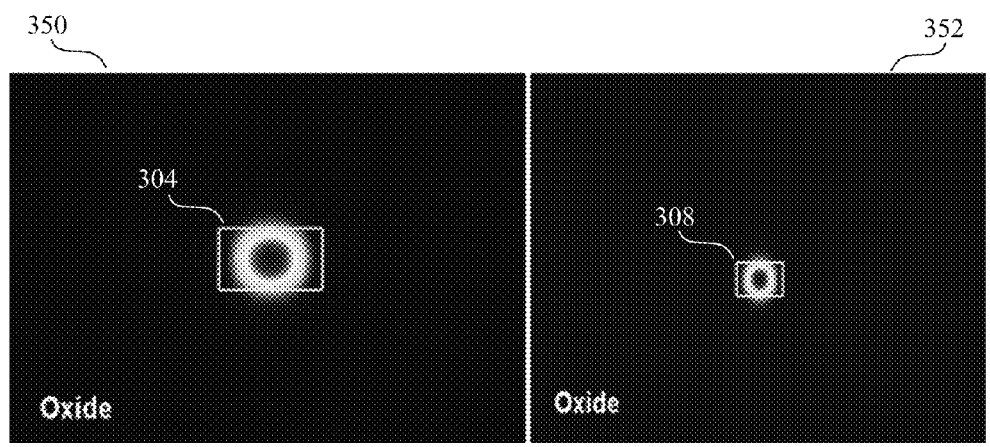
FIG. 3B shows the light confinements in different waveguide structures of the embodiment of FIG. 3A.
Figure 3B:
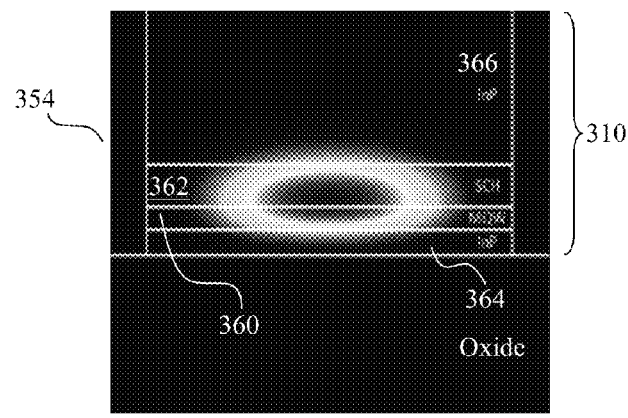

FIG. 3B shows the light confinements in different waveguide structures of the embodiment of FIG. 3A. FIG. 3B shows a plot 350 of light confinement in the waveguide 304, a plot 352 of light confinement in the a-Si waveguide 308, and a plot 354 of light confinement in the III-V optical gain medium 310. As shown in plot 354 of FIG. 3B, light may be confined in the multiple quantum well (MQW) region 360 and the separate confinement heterostructure (SCH) layer 362, which may be sandwiched between an indium phosphide (InP) underlayer or slab 364 and an InP cladding layer 366. The overall light confinement in the III-V MQW region 360 may be as high as about 27.63% (confinement factor), without optimization, as compared to approximately 4.3% in conventional designs or devices.

Taking into consideration the coupling scheme between different waveguide layers, various embodiments may provide different vertical structures having different vertical coupling schemes, for example, a stack-layered structure and a waveguide-embedded structure.

Figures 4A, 4B:
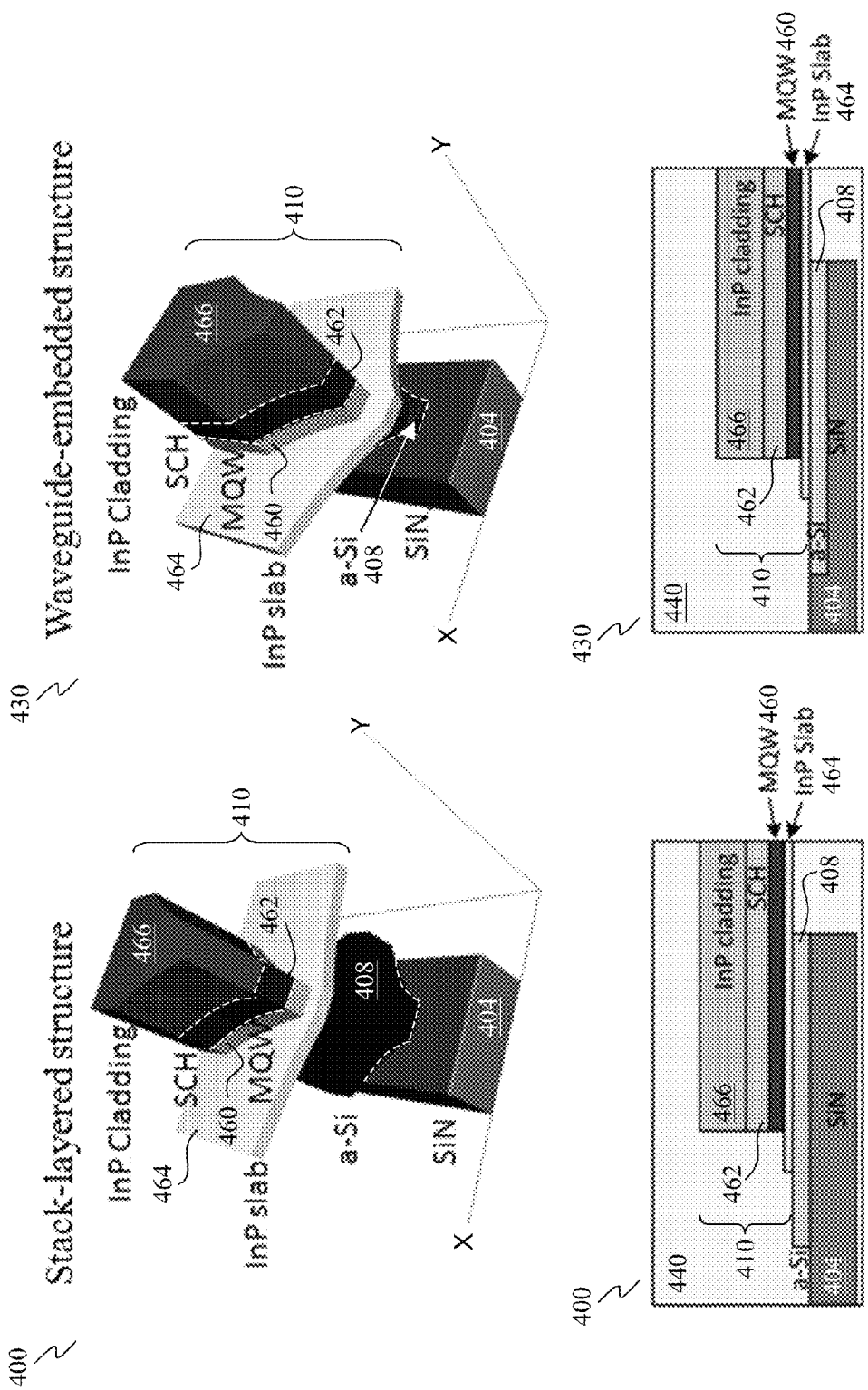
FIG. 4A shows a partial perspective view and a partial cross-sectional view of an optical light source having a stack-layered structure, according to various embodiments.
FIG. 4B shows a partial perspective view and a partial cross-sectional view of an optical light source having a waveguide-embedded structure, according to various embodiments.

FIG. 4A shows a partial perspective view and a partial cross-sectional view of an optical light source 400 having a stack-layered structure, according to various embodiments. The optical light source 400 may include a SiN (or SiON) waveguide 404, an amorphous silicon (a-Si) coupling structure or waveguide 408 arranged over and overlapping with the SiN waveguide 404, and a III-V optical gain medium 410 arranged over and overlapping with the a-Si waveguide 408 and the SiN waveguide 404. Therefore, in the stack-layered structure, the three waveguide layers (SiN waveguide 404, a-Si coupling waveguide 408 and III-V optical gain medium 410) may be stacked vertically. The SiN waveguide 404, the a-Si coupling waveguide 408 and the III-V optical gain medium 410 may be formed over a substrate (not shown), e.g. an SOI substrate, and may be embedded in a cladding layer or an insulation layer (e.g. an oxide layer) 440. It should be appreciated that the different partial views of the optical light source 400 shown in FIG. 4A may correspond to one half of the optical light source 400. For example, this may mean that the waveguide 404 and the coupling waveguide 408 shown in FIG. 4A may be a first waveguide section and a first coupling section respectively.

The optical gain medium 410 may include a stack arrangement having an InP slab 464, a multiple quantum well (MQW) region 460 with an arrangement of (but not limited to) 8×In$_{0.653}$Al$_{0.055}$Ga$_{0.292}$As well/9×In$_{0.45}$Al$_{0.089}$Ga$_{0.461}$As barriers, a separate confinement heterostructure (SCH) layer 462 (e.g. a In$_{0.528}$Al$_{0.131}$Ga$_{0.341}$As layer), and an InP cladding layer 466.

The a-Si coupling waveguide 408 may be in contact with at least a portion of the SiN waveguide 404, as shown in FIG. 4A, or may be spaced apart from the SiN waveguide 404. The optical gain medium 410 may be in contact with at least a portion of the a-Si coupling waveguide 408, as shown in FIG. 4A, or may be spaced apart from the a-Si coupling waveguide 408.

In various embodiments, coupling between different layers or waveguides may be realized by design of inverse tapers, for inverse taper coupling. As shown in FIG. 4A, the a-Si waveguide 408 may have a tapering region, at an end region of the a-Si waveguide 408, where a width of the tapering region of the a-Si waveguide 408 may increase in a direction away from the end region of the a-Si waveguide 408. The optical gain medium 410 may have a tapering region, at an end region of the optical gain medium 410, where a width of the tapering region of the optical gain medium 410 may increase in a direction away from the end region of the optical gain medium 410. The InP cladding layer 466, the SCH layer 462 and the MQW region 460 may have at least substantially similar tapering configuration or dimension. The InP slab 464 may have a different tapering configuration or dimension compared to the other layers of the optical gain medium 410.

As would be appreciated, each of the optical light source 200 (FIG. 2) and the optical light source 300 (FIG. 3A) are illustrated as employing a stack-layered structure.

FIG. 4B shows a partial perspective view and a partial cross-sectional view of an optical light source 430 having a waveguide-embedded structure, according to various embodiments. The optical light source 430 may include similar features as those for the optical light source 400 and may be as described in the context of the optical light source 400, except that the a-Si waveguide 408 is embedded inside the SiN waveguide 408. The a-Si waveguide 408 may be embedded in the SiN waveguide 408, to be coplanar with the SiN waveguide 408. It should be appreciated that the different partial views of the optical light source 430 shown in FIG. 4B may correspond to one half of the optical light source 430. For example, this may mean that the waveguide 404 and the coupling waveguide 408 shown in FIG. 4B may be a first waveguide section and a first coupling section respectively.

For verification of the vertical structures of various embodiments, the intensity coupling between the stacked layers was calculated for both the stack-layered structure and the waveguide-embedded structure. FIG. 5A shows a plot 500 of the calculated intensity transitions between the different waveguide layers of the embodiment of FIG. 4A, while FIG. 5B shows a plot 510 of the calculated intensity transitions between the different waveguide layers of the embodiment of FIG. 4B. It should be appreciated that shown in FIGS. 5A and 5B are respective halves of the optical light sources 400, 430.

For both structures, as may be observed, light may be gradually coupled from the SiN waveguide 404 to the gain medium stacked arrangement 410 strongly. The obtained coupling losses from the SiN waveguide 404 to the InP waveguide for the optical light source 400 with the stack-layered structure and the optical light source 430 with the waveguide-embedded structure may be respectively approximately −1.3 dB and approximately −2.5 dB. It should be appreciated that no optimization was done for both calculations. By optimizing the vertical coupling structure, such as in terms of at least one of the a-Si waveguide thickness, the coupling length, or the InP cladding layer thickness, the coupling loss may be further reduced.

As described above, various embodiments may provide a structure for hybrid Si lasers, e.g. a multi-layer stacked structure for hybrid Si lasers. Various embodiments may employ a low-loss SiN or SiON waveguide as the laser cavity. Various embodiments may employ a chirped DBR design in the SiN or SiON layer for the formation of the laser cavity. Using chirped DBRs for the laser cavity may avoid the process of low-production surface polishing. Various embodiments may employ amorphous silicon (a-Si) as an intermediate layer for enhanced vertical coupling, for example for coupling between the SiN or SiON waveguide and the optical gain medium having a III-V material.

Various embodiments may enable a cost effective implementation and CMOS compatible fabrication of the Si devices of various embodiments. Further, the optical light sources of various embodiments may be ready for photonic integration for optical transceivers.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

While the preferred embodiments of the devices and methods have been described in reference to the environment in which they were developed, they are merely illustrative of the principles of the inventions. The elements of the various embodiments may be incorporated into each of the other species to obtain the benefits of those elements in combination with such other species, and the various beneficial features may be employed in embodiments alone or in combination with each other. Other embodiments and configurations may be devised without departing from the spirit of the inventions and the scope of the appended claims.

The invention claimed is:

1. An optical light source comprising:
   a waveguide comprising two reflectors arranged spaced apart from each other to define an optical cavity therebetween;
   an optical gain medium; and
   a coupling structure arranged to couple light between the optical cavity and the optical gain medium,
   wherein the coupling structure comprises an additional waveguide, the additional waveguide being arranged in contact with the optical gain medium,
   wherein the waveguide comprises a first waveguide section and a second waveguide section spaced apart from the first waveguide section, and
   wherein the coupling structure comprises:
   a first coupling section arranged to couple light between the first waveguide section and the optical gain medium; and
   a second coupling section spaced apart from the first coupling section, the second coupling section arranged to couple light between the second waveguide section and the optical gain medium.

2. The optical light source as claimed in claim 1, wherein the coupling structure is arranged spaced apart from the optical cavity.

3. The optical light source as claimed in claim 1, wherein the waveguide comprises a material capable of inducing a propagation loss of less than 2 dB/cm.

4. The optical light source as claimed in claim 1, wherein the waveguide comprises at least one of a silicon nitride-based material or silicon oxynitride-based material.

5. The optical light source as claimed in claim 1, wherein the coupling structure is embedded in the waveguide.

6. The optical light source as claimed in claim 1, wherein the coupling structure has a refractive index in between respective refractive indices of the waveguide and the optical gain medium.

7. The optical light source as claimed in claim 1, wherein the coupling structure has a thickness between about 50 nm and about 500 nm.

8. The optical light source as claimed in claim 1, wherein the coupling structure comprises amorphous silicon or polycrystalline silicon.

9. The optical light source as claimed in claim 1, wherein the optical gain medium comprises a multiple quantum well region.

10. The optical light source as claimed in claim 1, wherein the optical gain medium comprises a cladding layer.

11. The optical light source as claimed in claim 10, wherein the cladding layer has a thickness between about 0.1 μm and about 1.5 μm.

12. The optical light source as claimed in claim 1, wherein a section of the optical gain medium is configured as a saturable absorber section.

13. The optical light source as claimed in claim 1, wherein the optical gain medium comprises a III-V material.

14. The optical light source as claimed in claim 1, wherein at least one of the two reflectors comprises a Bragg reflector.

15. The optical light source as claimed in claim 1, wherein at least one of the coupling structure or the optical gain medium comprises a tapering region.

16. The optical light source as claimed in claim 1,
   wherein the first waveguide section and the first coupling section are arranged spaced apart from each other, and
   wherein the second waveguide section and the second coupling section are arranged spaced apart from each other.

17. The optical light source as claimed in claim 1, wherein the optical gain medium is arranged spaced apart from the first coupling section and the second coupling section.

18. An optical light source comprising:
   a waveguide comprising two reflectors arranged spaced apart from each other to define an optical cavity therebetween;
   an optical gain medium; and
   a coupling structure arranged to couple light between the optical cavity and the optical gain medium;
   wherein the waveguide comprises a first waveguide section and a second waveguide section spaced apart from the first waveguide section, and
   wherein the coupling structure comprises:
   a first coupling section arranged to couple light between the first waveguide section and the optical gain medium; and
   a second coupling section spaced apart from the first coupling section, the second coupling section arranged to couple light between the second waveguide section and the optical gain medium.

* * * * *